(12) United States Patent
Kropp

(10) Patent No.: US 6,488,417 B2
(45) Date of Patent: Dec. 3, 2002

(54) OPTO-ELECTRONIC ASSEMBLY HAVING AN INTEGRATED IMAGING SYSTEM

(75) Inventor: Jörg-Reinhardt Kropp, Berlin (DE)

(73) Assignee: Infineon Technologies AG, München (DE)

( * ) Notice: Subject to any disclaimer, the term of this patent is extended or adjusted under 35 U.S.C. 154(b) by 60 days.

(21) Appl. No.: 09/732,140

(22) Filed: Dec. 7, 2000

(65) Prior Publication Data

US 2002/0071639 A1 Jun. 13, 2002

(30) Foreign Application Priority Data

Dec. 7, 1999 (DE) .......................... 199 59 781

(51) Int. Cl.⁷ ................................ G02B 6/36
(52) U.S. Cl. .................. 385/88; 385/90; 385/92; 385/93; 385/49
(58) Field of Search .................. 385/88–94, 31–37, 385/48–50, 14

(56) References Cited

U.S. PATENT DOCUMENTS

| 4,616,899 A | 10/1986 | Schlafer |
| 4,695,719 A | 9/1987 | Wilwerding |
| 4,699,453 A | 10/1987 | Roberts |
| 5,163,117 A | 11/1992 | Imanishi |
| 6,309,566 B1 * | 10/2001 | Muller et al. .................. 385/92 |
| 6,364,542 B1 * | 4/2002 | Deane et al. .................. 385/92 |
| 2001/0015405 A1 * | 8/2001 | Loecklin ..................... 250/226 |

FOREIGN PATENT DOCUMENTS

| DE | 43 23 828 C2 | 1/1995 |
| DE | 44 42 672 A1 | 5/1996 |
| DE | 195 10 559 C1 | 7/1996 |
| DE | 196 16 969 A1 | 10/1997 |
| DE | 197 11 138 C2 | 9/1998 |
| EP | 0 664 585 A1 | 7/1995 |
| GB | 2 312 551 A | 10/1997 |

* cited by examiner

Primary Examiner—Hemang Sanghavi
(74) Attorney, Agent, or Firm—Laurence A. Greenberg; Werner H. Stemer; Ralph E. Locher

(57) ABSTRACT

An opto-electronic assembly includes an opto-electronic transducer, an optical path and an imaging system in the form of a translucent hollow body having internal optical boundary surfaces forming beam-forming boundary surfaces, in order to achieve effective protection against environmental influences for the opto-electronic transducer and the imaging system in a simple manner. The beam-forming boundary surfaces are preferably in the form of lens surfaces. There is an additional possibility of providing a mirror surface or a reflective surface on the basis of an association between the opto-electronic transducer and the optical path. The opto-electronic transducer and the translucent hollow body are is expediently embedded in a potting compound.

13 Claims, 2 Drawing Sheets

OPTO-ELECTRONIC ASSEMBLY HAVING AN INTEGRATED IMAGING SYSTEM

BACKGROUND OF THE INVENTION

Field of the Invention

The invention relates to the field of optical elements and can be used for constructing the type of connections between optical fibers and opto-electronic components in which an opto-electronic transducer and an optical path, for example a downstream lens system or an optical fiber, have an imaging system disposed between them which has a translucent body with beam-forming boundary surfaces.

In a known opto-electronic assembly of that kind, a plurality of opto-electronic transmitting or receiving elements are disposed on a circuit board and are combined with an optical element to form a first coupling element. The optical element is disposed at a distance from a transmitting element and includes a silicon body which is translucent in the infrared range. That translucent body has two lateral surfaces situated in the beam path of the respective transmitting element. One of the lateral surfaces has a plurality of cambers acting as convex lenses and the other has a planer construction. That coupling element has an associated pluggable second coupling element with an identical mirrored construction, holds ends of a plurality of optical fibers each forming an optical path. In that case, the two translucent silicon bodies and the surrounding air form an imaging system, according to German Published, Non-Prosecuted Patent Application DE 44 42 672 A1.

In a known assembly of that type, the opto-electronic component is not protected against environmental influences. Opto-electronic components are frequently protected against environmental influences by encapsulating them in a potting compound, according to German Patent DE 197 11 138 C2, corresponding to U.S. application Ser. No. 09/390, 167, filed Sep. 7, 1999. In the case of assemblies having an integrated imaging system, it is also customary to place the assemblies in a hermetically sealed housing which has a window, as in European Patent Application 0 664 585 A1, corresponding to U.S. Pat. No. 5,566,265. Such protection of the assembly is complex and is associated with significant costs. If an assembly having an integrated imaging system were encapsulated in a potting compound, the optical effect of the imaging system would be severely impaired, because the region between the imaging system and the adjacent opto-electronic transducers would then be filled with potting compound. Specifically, if a normal translucent potting compound were used, the difference between the refractive indices of the potting compound and of the imaging system would be too small for satisfactory imaging.

SUMMARY OF THE INVENTION

It is accordingly an object of the invention to provide an opto-electronic assembly having an integrated imaging system, which overcomes the hereinafore-mentioned disadvantages of the heretofore-known devices of this general type and which has a structure permitting opto-electronic transducers and optically active regions of the assembly to be easily protected against environmental influences.

With the foregoing and other objects in view there is provided, in accordance with the invention, an opto-electronic assembly, comprising an opto-electronic transducer; an optical path; and an imaging system for coupling the opto-electronic transducer and the optical path, the imaging system having a translucent body, the translucent body having two parts enclosing a gas filled cavity, and the translucent body having internal optical boundary surfaces with subregions forming beam-forming boundary surfaces.

In such an embodiment of the assembly, the optically active boundary surfaces of the translucent body are moved to inside the body, which means that their effectiveness can no longer be influenced by potting compounds. To this end, the two parts of the translucent body are expediently connected, in particular bonded, to one another tightly. For this purpose, the translucent body is advantageously made of a polymer material such as polycarbonate (PC) or polymethyl-methacrylate (PMMA).

In accordance with another feature of the invention, the cavity in the translucent body is filled with air, but another gas with a low refractive index, such as nitrogen or argon, is also suitable. The translucent body provided with internal beam-forming boundary surfaces may have a different construction in terms of the beam-forming boundary surfaces. Beam-forming boundary surfaces in the form of lens surfaces may be disposed parallel or at an angle, particularly at right angles, to one another. The light beams can be deflected by using inclined reflective surfaces. It is also possible for the reflective surface to be formed by an inclined exterior surface of the translucent body, particularly by applying a reflective layer. In addition, when the light path which can be coupled is in the form of an optical fiber, the association between the translucent body and the end of the optical fiber can be chosen in such a way that the support holding the end of the optical fiber forms one part of the two part translucent hollow body. This permits the volume of the assembly to be reduced.

In accordance with a further feature of the invention, the translucent body together with the opto-electronic transducer are embedded in a translucent potting compound. In this case, the optical path can run between the opto-electronic transducer and the translucent body within the potting compound. The potting compound is preferably a silicone gel.

In accordance with an added feature of the invention, the support holding the end of an optical fiber may likewise be at least partly embedded in the potting compound. In addition, the walls of the translucent body, which are situated in the respective beam path, can have optical fiber channels embedded in them which form an optical path from the outside of the translucent body into the interior region.

In accordance with a concomitant feature of the invention, a plurality of opto-electronic transducers and light paths are disposed as respective arrays. These two arrays then expediently have a translucent body disposed between them which encloses a single cavity. Subregions of the interior optical boundary surfaces of this body are in the form of arrays of beam-forming boundary surfaces.

Other features which are considered as characteristic for the invention are set forth in the appended claims.

Although the invention is illustrated and described herein as embodied in an opto-electronic assembly having an integrated imaging system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
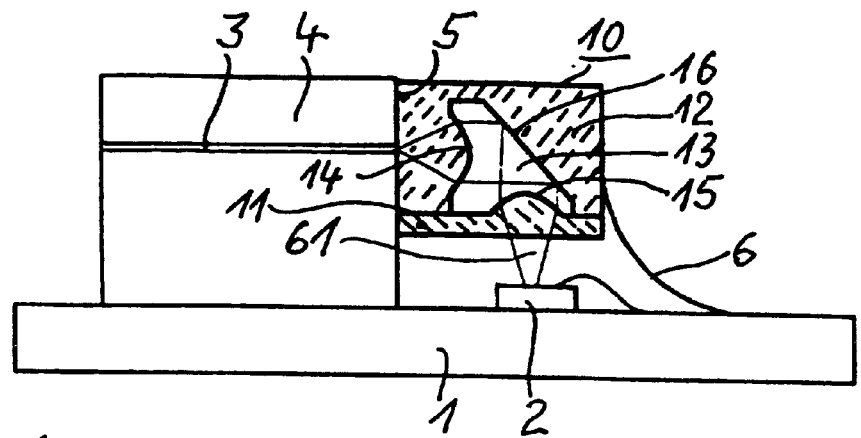
FIG. 1 is a diagrammatic, partly sectional, side-elevational view of an assembly, embedded in a potting compound, with an angled association between an optical fiber and an opto-electronic transducer and with beam-forming internal boundary surfaces of the translucent body having an appropriate structure.

Referring now to the figures of the drawings in detail and first, particularly, to FIG. 1 thereof, there is seen an opto-electronic transducer 2 which is disposed on a substrate 1 and from which light emerging vertically upward is intended to enter a horizontally disposed optical path 3. For this purpose, the optical path 3 is in the form of an optical fiber and is disposed on a support 4 which is likewise situated on the substrate 1. The optical fiber 3 ends at a flat end surface 5 of the support 4.

A beam path of the opto-electronic transducer 2 contains a translucent body 10 including a shallow bottom part 11 and a deeper top part 12. The top part 12, in particular, is provided with an internal recess, so that the bottom part 11 and the top part 12 enclose a cavity 13. The hollow body 10 has three internal boundary surfaces running vertically with respect to the plane of the drawing. These boundary surfaces include a boundary surface 14 which is associated with the optical fiber 3 and is in the form of a lens, a boundary surface 15 that is associated with the opto-electronic transducer 2 and is likewise in the form of a lens, and a boundary surface 16 which is inclined by approximately 45 degrees with respect to the other two boundary surfaces. Since the cavity 13 is filled with air and the body 10 is made of a polymer material, such as polycarbonate, a light beam entering the cavity 13 from the optical fiber or from the opto-electronic transducer is reflected at the boundary surface 16.

The opto-electronic transducer 2, the translucent hollow body 10 as well as the support 4 are embedded in a translucent potting compound 6 which completely fills a space between the opto-electronic transducer 2 and the body 10. Therefore, another optical path 61 between the opto-electronic transducer 2 and the translucent body 10 runs entirely within the potting compound 6.

Figure 2:
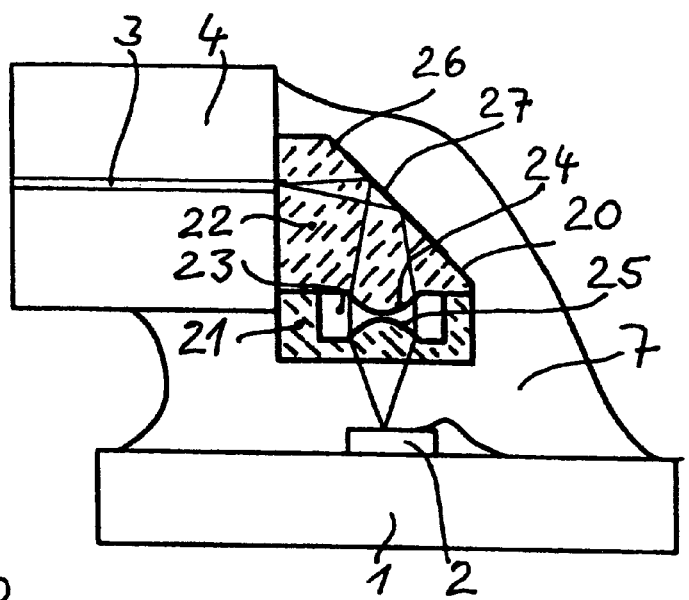
FIG. 2 is a view similar to FIG. 1 of an embedded assembly with a likewise angled association between an optical fiber and an opto-electronic transducer and with a translucent body in which an exterior surface is reflective for the purpose of guiding light beams.

In principle, the assembly shown in FIG. 2 has the same construction as the assembly shown in FIG. 1. However, a translucent hollow body 20 which forms an imaging system has a different construction and the optical fiber 3 with the support 4 is disposed a little higher. In this case, the body 20 likewise includes a shallow bottom part 21 and a top part 22 with a somewhat more extensive depth. A cavity 23 is formed between the two parts. An internal boundary surface 24 of the top part 22 and an internal boundary surface 25 of the bottom part 21 are in the form of lenses and are disposed opposite one another. In order to be able to input a light beam arriving through the optical fiber 3 or emerging from the opto-electronic transducer 2 into the other respective optical element, the top part 22 of the body 20 is provided with an exterior surface 26 having an inclination of approximately 45 degrees. A reflective layer 27 has been applied to this exterior surface, so that a light beam penetrating the body 20 is reflected at this boundary surface. In this case too, the opto-electronic transducer 2, the body 20 and the support 4 are embedded in a potting compound 7. The body 20 is virtually encapsulated in this potting compound in the present case.

Figure 3:
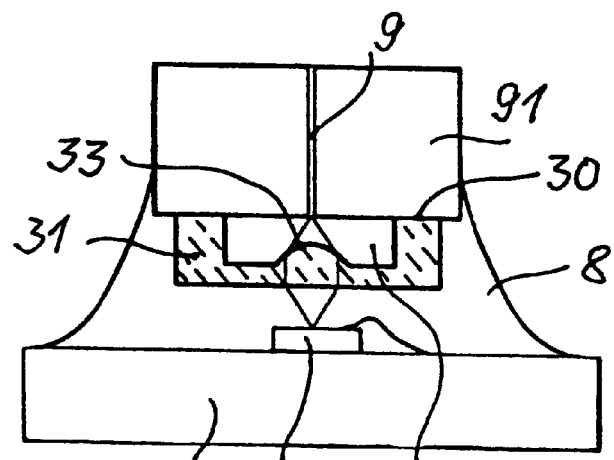
FIG. 3 is another view similar to FIGS. 1 and 2 of an embedded assembly with a rectilinear association between an optical fiber and an opto-electronic transducer, in which a support for the optical fiber forms part of the translucent body.

In the case of the assembly shown in FIG. 3, the electronic transducer 2 and an optical path 9 are oriented linearly with respect to one another. A support 91 for the optical path 9 forms a top part of a translucent hollow body 30 having a bottom part 31 which is disposed above the opto-electronic transducer 2 and is constructed to have an internal boundary surface 33 in the form of a lens. All parts of the assembly are embedded in a potting compound 8.

Figure 4:
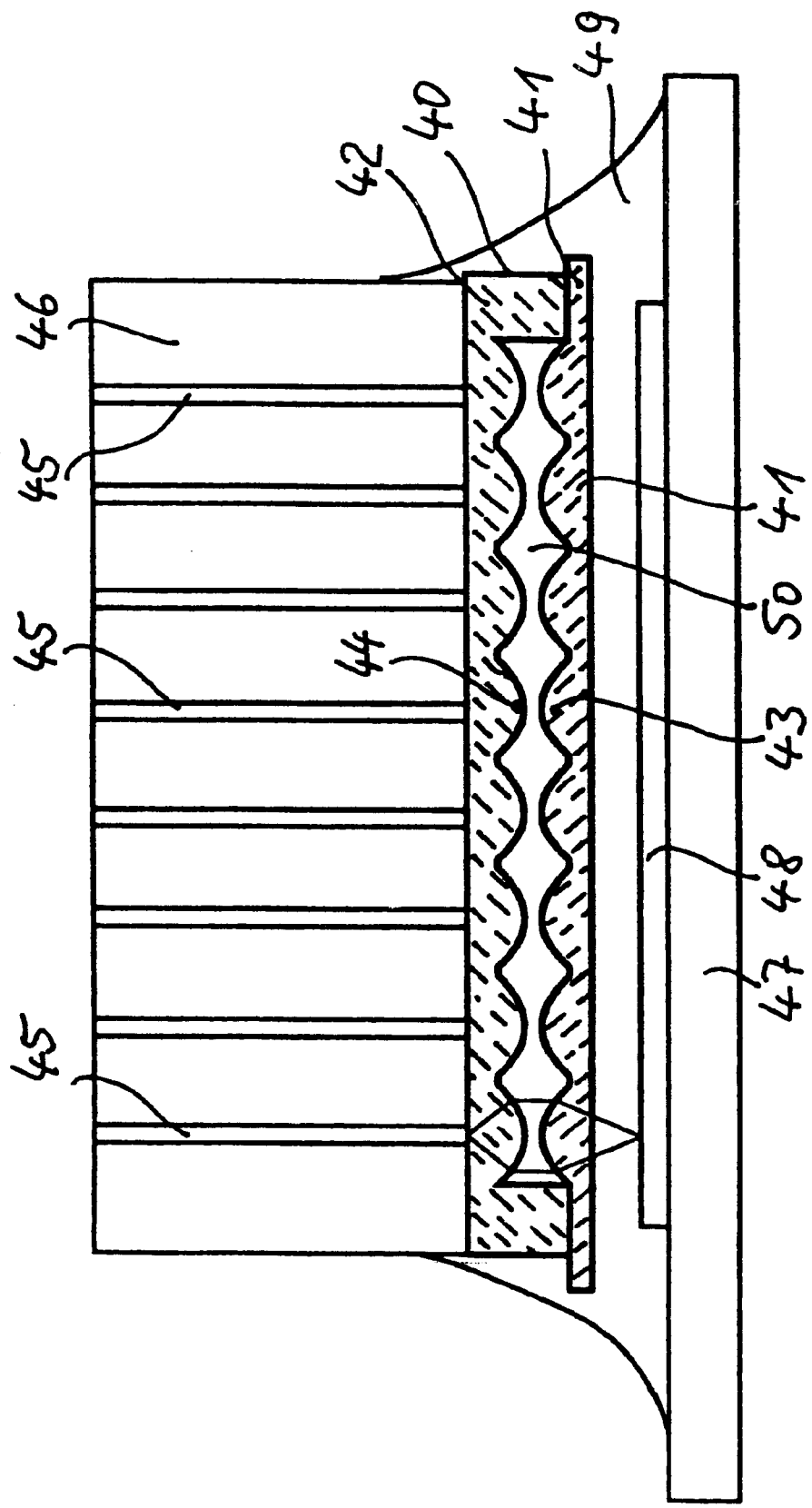
FIG. 4 is a side-elevational view of an embedded assembly with opto-electronic transducers and optical fibers disposed in the form of arrays and with a single translucent body associated with the arrays.

In the case of the assembly shown in FIG. 4, a diode array 48 is disposed on a substrate 47. An associated array which is disposed vertically above the diode array is formed from optical paths in the form of optical fibers 45 and has a support 46. A translucent body 40 is disposed between the diode array 48 and the optical fiber array 46. The translucent body 40 has a gas-filled cavity 50, a shallow bottom part 41, a likewise relatively shallow top part 42 and is provided with interior boundary surfaces which run parallel to one another and each have a respective lens array 43 and 44. The diode array 48 with the substrate 47, the body 40 as well as the support 46 are embedded in a potting compound 49. In this case too, the potting compound 49 completely fills an interspace between the hollow translucent body 40 and the diode array 48.

I claim:

1. An opto-electronic assembly, comprising:
   an opto-electronic transducer;
   an optical path; and
   an imaging system for coupling said opto-electronic transducer and said optical path, said imaging system having a translucent body, said translucent body having two parts enclosing a gas filled cavity, and said translucent body having internal optical boundary surfaces with subregions forming beam-forming boundary surfaces.

2. The opto-electronic assembly according to claim 1, wherein said cavity is filled with air.

3. The opto-electronic assembly according to claim 1, wherein said beam-forming boundary surfaces are lens surfaces.

4. The opto-electronic assembly according to claim 1, wherein some of said beam-forming boundary surfaces are lens surfaces and some of said beam-forming boundary surfaces are mirror surfaces.

5. The opto-electronic assembly according to claim 1, wherein said translucent body has an exterior surface with a subregion in the form of a mirror surface.

6. The opto-electronic assembly according to claim 1, including a translucent potting compound in which said translucent body and said opto-electronic transducer are embedded.

7. The opto-electronic assembly according to claim 6, including another optical path within said potting compound between said opto-electronic transducer and said translucent body.

8. The opto-electronic assembly according to claim 6, including a support embedded in said potting compound, said optical path being an optical fiber to be coupled, and said optical fiber being disposed in said support.

9. The opto-electronic assembly according to claim 6, wherein said optical path is a first optical path in the form of an optical fiber to be coupled, a support is embedded in said potting compound, said first optical fiber is disposed in said support, and a second optical path is disposed within said potting compound between said opto-electronic transducer and said translucent body.

10. The opto-electronic assembly according to claim 8, wherein said support is one of said two parts of said translucent body.

11. The opto-electronic assembly according to claim 9, wherein said support is one of said two parts of said translucent body.

12. The opto-electronic assembly according to claim 1, wherein said translucent body has a wall with optical fiber channels embedded therein forming said optical path from outside said translucent body into said cavity.

13. The opto-electronic assembly according to claim 1, wherein:
    said opto-electronic transducer is one of a plurality of opto-electronic transducers;
    said optical path is one of a plurality of optical paths in the form of optical fibers;
    said opto-electronic transducers and said optical fibers form respective arrays;
    said translucent body is disposed between said arrays and encloses said cavity; and
    said subregions of said internal optical boundary surfaces of said translucent body are arrays of beam-forming boundary surfaces.

* * * * *